(12) United States Patent
Chen et al.

(10) Patent No.: US 6,555,893 B1
(45) Date of Patent: Apr. 29, 2003

(54) BAR CIRCUIT FOR AN INTEGRATED CIRCUIT

(75) Inventors: David Cheng-Hsiung Chen, Taipei (TW); Joe Ko, Hsin-Chu (TW)

(73) Assignee: United Microelectronics Corp. (TW)

( * ) Notice: Subject to any disclaimer, the term of this patent is extended or adjusted under 35 U.S.C. 154(b) by 0 days.

(21) Appl. No.: 10/054,934

(22) Filed: Jan. 25, 2002

(51) Int. Cl.⁷ .......................... H01L 29/00; H01L 29/80
(52) U.S. Cl. .................... 257/531; 257/528; 257/277; 257/516; 257/495
(58) Field of Search ............................ 257/531, 108, 257/422, 423, 424, 425, 427, 571, 277, 495, 516, 528; 438/381, 243, 359, 386, 388; 361/782, 811, 821; 333/25, 32; 336/200, 186, 187

(56) References Cited

U.S. PATENT DOCUMENTS 6,008,713 A * 12/1999 Nasserbakht ................. 336/200
2002/0047182 A1 * 4/2002 Wong et al. ................. 257/529

* cited by examiner

Primary Examiner—Minh Loan Tran
Assistant Examiner—Tan Tran

(57) ABSTRACT

The present invention provides a bar circuit for reducing cross talk and eddy current of an integrated circuit. The bar circuit comprises a semiconductor substrate with a first conductivity type; a strip of first well with a second conductivity type in the semiconductor substrate; and a strip of second well with the second conductivity type in the semiconductor substrate. The strip of second well is located below and adjacent to the strip of first well, whereby forms a junction barrier for reducing the cross talk and the eddy current.

14 Claims, 3 Drawing Sheets

BAR CIRCUIT FOR AN INTEGRATED CIRCUIT

BACKGROUND OF THE INVENTION

1. Field of the Invention

The invention relates to a bar circuit for an integrated circuit, and more particularly to a bar circuit an on-chip inductor circuit.

2. Description of the Prior Art

As integrated circuit devices continue to shrink in dimension, the demand to integrate different functionality on the same integrated circuit die continues to grow. For example, portable wireless communication products have become high volume consumer devices. Some of these devices are now operating in the 1–2 GHz frequency range. There is, as a consequence, a demand to integrate RF front end circuits into high-yield silicon integrated circuit processes to allow a combination of analog, digital, and RF functions on the same integrated circuit die. Yet, some considerable difficulty has been experienced in attempts to fabricate inductors having high quality factors (Q) in silicon technology for RF circuits which are used in communications.

Attempts have been made to build high-Q inductors in silicon integrated circuit technology,. but have yielded Q factors of only three to eight. Problems associated with the use of silicon technology in these scenarios, in part, is a result of the conductivity of silicon substrate which tends to induce losses. As frequencies approach the self-resonant frequency, the inductance value decreases which is most undesirable. Losses in the conductive silicon substrates can be increased by the high dielectric constant of the insulators under the conductors and the relatively large values of stray capacitance coupling to the silicon substrate.

Some attempts have been made to provide oxide-encased, spiral-type inductors for silicon technology, with such encased inductors being disposed over a cavity which is etched into the silicon substrate. Others have attempted to provide higher-Q inductors in a five or six-level metal BiCMOS technology. The conductors in these instances are still encased in oxide but are far removed from the silicon substrate by virtue of a large number of insulator and metal levels. The number of these levels, however, is far in excess of the two to four levels commonly utilized in CMOS technology.

An exemplary lumped circuit element for an on-chip inductor is shown in FIG. 1. Ls represents an intrinsic inductor; Rs does a parasitic capacitance; Cp does a parasitic capacitance of an on-chip inductor; Cox does the capacitance between the on-chip inductor and the substrate; and Rb does a resistance to simulate the eddy current portion. Cox and Rb contribute to the substrate loss. When the on-chip inductor is in an operation mode, AC current may generate the change of the magnetic flux and thus induce eddy current in the substrate. Furthermore, the inductor itself can be considered as an energy tank. More eddy current generated in the substrate means more energy loss, equivalent to the degradation of Quality factor. In addition, cross talk of the inductor through the substrate happens because of the lower Rb contributing to the substrate.

In general, guard rings are used to prevent from the cross talk. However, the eddy current still exists and causes the degraded performance of the inductor. On the other hand, metal shield may be utilized to reduce the eddy current, but the inductor performance is sacrificed.

SUMMARY OF THE INVENTION

It is an object of the present invention to provide a bar circuit on an integrated circuit. The bar circuit can reduce cross talk and eddy current induced by the inductors of the integrated circuit with increasing the resistance of a semiconductor substrate.

It is another object of the present invention to provide a bar circuit in an on-chip inductor circuit. Strips of deep well below generally strips of well in a semiconductor substrate can reduce electromagnetic interference caused by the semiconductor substrate.

In the present invention provides a bar circuit for reducing cross talk and eddy current of an integrated circuit comprising a semiconductor substrate with a first conductivity type. A strip of first well with a second conductivity type is in the semiconductor substrate. A strip of second well with the second conductivity type is in the semiconductor substrate, below and adjacent to the strip of first well, whereby forms a junction barrier for, reducing the cross talk and the eddy current.

BRIEF DESCRIPTION OF THE DRAWINGS

A better understanding. of the invention may be derived by reading the following detailed description with reference to the accompanying drawing wherein.

DESCRIPTION OF THE PREFERRED EMBODIMENT

While the invention is particularly shown and described with reference to the following preferred embodiment, it will be understood by those skilled in the art that many other modifications and variations may be made thereto without departing from the broader spirit and scope of the invention as set forth in the claims. Use of the disclosed structure or method is not limited to specific on-chip inductor circuit. The specification and drawings are according to be regarded as being illustrative, rather than being restrictive.

Furthermore, there is shown a representative portion of a semiconductor structure of the present invention in enlarged, cross-sections of the two dimensional views at several stages of fabrication. The drawings are not necessarily to scale, as the thickness of the various layers are shown for clarify of illustration and should not be interpreted in a limiting sense. Accordingly, these regions will have dimensions, including length, width and depth, when fabricated in an actual device.

In the present invention, a bar circuit is for reducing cross talk and eddy current of an integrated circuit comprising a semiconductor substrate with a first conductivity type; an inductor device on the semiconductor substrate; a plurality of strips of first wells with a second conductivity type in the semiconductor substrate and below the inductor device; and a plurality of strips of second wells with the second conductivity type below and adjacent to the strips of first wells, whereby form a plurality of junction barriers for blocking the cross talk and the eddy current.

Figure 1:
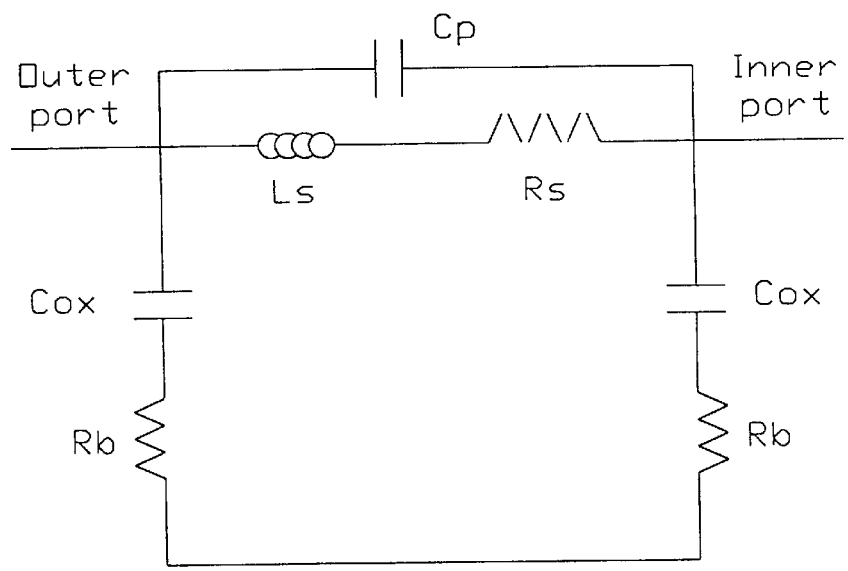
FIG. 1 is a partially equivalent circuit illustrating the embodiment in accordance with the prior art.
Figure 2:
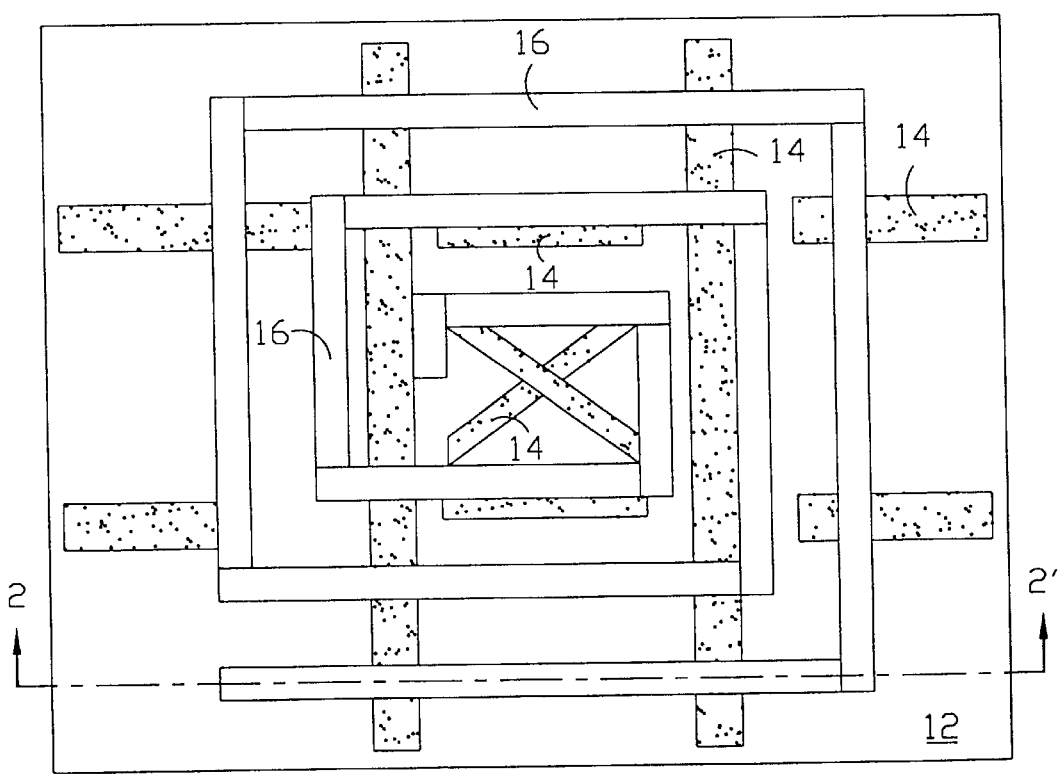
FIG. 2 is a partially schematic top plan view of an embodiment illustrating the architecture of an integrated circuit with on-chip inductors in accordance with the present invention.

One embodiment of the present invention in FIG. 2 shows a partially schematic top plan view of an embodiment illustrating the architecture of an integrated circuit with on-chip inductors in accordance with the present invention. A die 10 is comprised of a semiconductor substrate 12 such as, for example, gallium arsenide, silicon with or without dopants, germanium, or the like. Multitudes of strips of wells 14 are in the semiconductor substrate 12. To be specific, the arrangement of strips of wells is not limited within one mentioned in FIG. 2, and it can be any type of arrangement. A conductive layer is formed on the semiconductor substrate 12 and patterned to form a planar spiral inductor 16. It is well known that the geometry of the inductor is also not limited to the spiral one mentioned above.

Figure 3A:
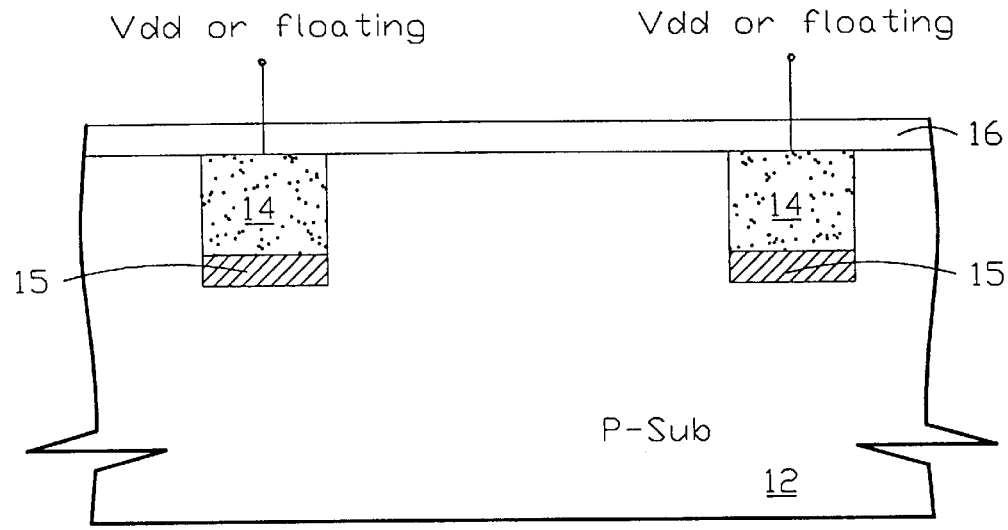
FIGS. 3A–3D are partially schematic section views taken along the line 2—2 of FIG. 2.

Next, FIG. 3A is partially schematic section view taken along the line 2—2 of FIG. 2. For simplicity, there are some layers and components not shown in the cross-sectional diagram. The spiral inductor 16 is on the semiconductor substrate 12. In the first embodiment, the semiconductor substrate 12 is a p-type silicon substrate. The strips of wells 14 of n-type are in the semiconductor substrate 12. As a key of the present invention, strips of deep wells 15 are below and adjacent to the strips of well 14 of n-type. The strips of deep wells 15 have n-type dopants more than the strips of wells 14 have, and form p-n-p junction barriers. The depth of the strips of deep wells 15 from a surface of the semiconductor substrate 12 is about 3 to 5 um. Furthermore, the strips of wells 14 can be coupled to exterior high voltage (Vdd) or be floating.

When the spiral inductor 16 is in operation mode, it can generate the change of the magnetic flux and thus induce eddy current in the semiconductor substrate 12. The p-n-p junction barriers formed by the cooperation of the strips of deep wells 15 with the strips of wells 14 and the semiconductor substrate 12 can block the eddy current induced by the on-operation spiral inductor 16. Furthermore, the formation of the strips of deep wells 15 can increase the resistance of the semiconductor substrate 12 and further eliminate the possibility of cross talk through the deep area of the semiconductor substrate 12.

Figure 3B:
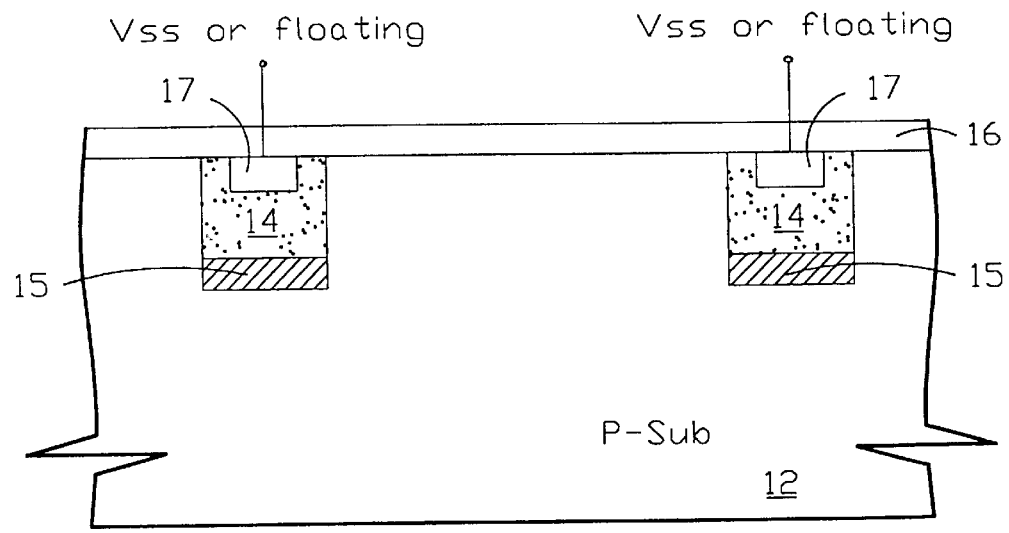

FIG. 3B is the second embodiment for the architecture of the present invention. The semiconductor substrate 12 is doped with p-type ions. Both the strips of wells 14 and the strips of deep wells 15 are doped with n-type ions of different concentrations. In the second embodiment, another strips of p-wells 17 are formed in the strips of wells 14. The strips of p-wells 17 can be coupled to exterior low voltage (Vss) or be floating.

Figure 3C:
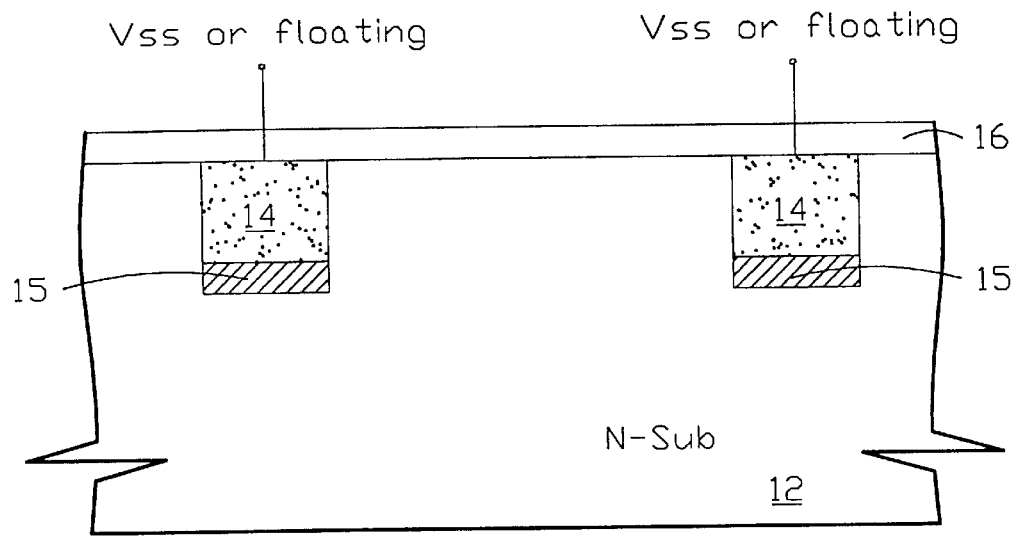

FIG. 3C is the third embodiment of the present invention. The semiconductor substrate 12 is doped with n-type ions. Both the strips of wells 14 and the strips of deep wells 15 are individually doped with p-type ions of different concentrations. The n-p-n junction barriers are formed in the third embodiment, and also enable to block the eddy current induced by the spiral inductor 16 and reduce the cross talk. The strips of wells 14 of p-type can be coupled to the low voltage (Vss) or be floating.

Figure 3D:
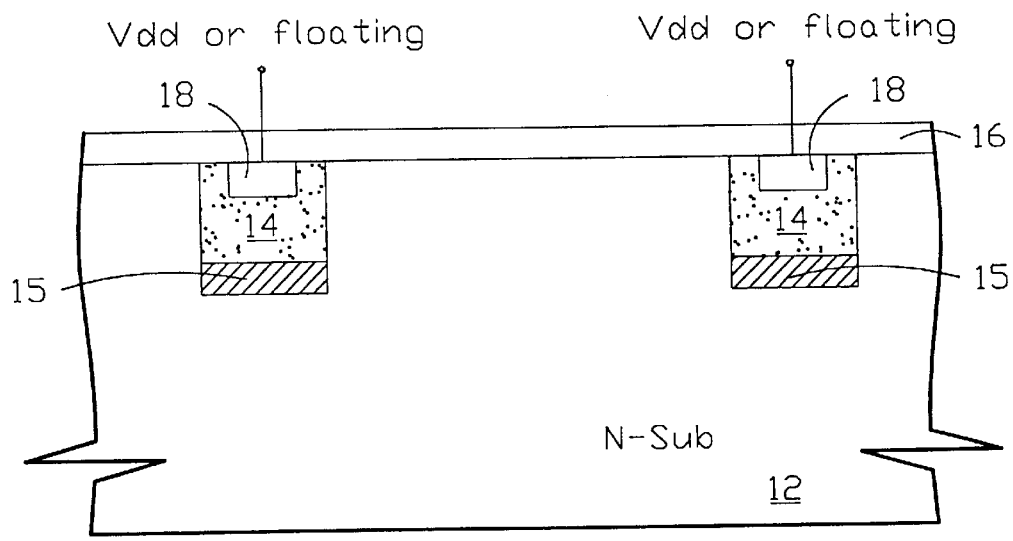

FIG. 3D is the fourth embodiment of the present invention. The semiconductor substrate 12 is doped with n-type ions. Both the strips of wells 14 and the strips of deep wells 15 are individually doped with p-type ions of different concentrations. Another strips of n-wells 18 are formed in the strips of wells 14 and coupled to the high voltage (Vdd) or floating. Both n-p-n junction barriers and p-n-p junction barriers of the present invention can block the generation of induced eddy current and reduce the possibility of cross talk. Thus, the energy of the inductor can't be consumed in the semiconductor substrate 12. Furthermore, the Quality factor can be improved and noise in the semiconductor substrate can be reduced with the architectures of the present invention. To be specific, the strips of deep wells are also used in the mixed-mode or RF products without additional complexity of the manufacture process.

The present invention provides the architecture of deep wells in an integrated circuit with on-chip inductors. The strips of deep wells can improve the Quality factor of the integrated circuit by blocking the induced eddy current and eliminating the possibility of cross talk through the deep area of substrate. Thus, the whole performance of the integrated circuit can be improved.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A bar circuit for reducing cross talk and eddy current of an integrated circuit, said bar circuit comprising:

a semiconductor substrate with a first conductivity type;

a plurality of first strips having a first well and a second well with a second conductivity type in said semiconductor substrate, said second well below and adjacent to said first well, wherein said first strips arrange in approximately parallel; and a plurality of second strips having a third well and a fourth well with said second conductivity type in said semiconductor substrate, wherein said second strips arrange in approximately perpendicular to said first strips.

2. The bar circuit of claim 1, wherein said first conductivity type is opposite to said second conductivity type.

3. The bar circuit of claim 1, wherein said first strip is coupled to an exterior voltage.

4. The bar circuit of claim 1, wherein said first well and said third well are floating.

5. The bar circuit of claim 1, wherein said second well and said fourth well separately have dopant concentrations different from dopant concentrations of said first well and said third well.

6. The bar circuit of claim 1, wherein said integrated circuit comprises an on-chip inductor on said semiconductor substrate.

7. The bar circuit of claim 1, wherein said first strip and said second strip further comprise a fifth well and a sixth well with said first conductivity type separately in said first well and said third well.

8. The bar circuit of claim 7, wherein said fifth well and said sixth well are coupled to an exterior voltage.

9. The bar circuit of claim 7, wherein said fifth well and said sixth well are floating.

10. A bar circuit for reducing cross talk and eddy current of an integrated circuit, said bar circuit comprising:

a semiconductor substrate with a first conductivity type;

an inductor device on said semiconductor substrate;

a plurality of first strips having a first well and a second well with a second conductivity type in said semiconductor substrate, said second well below and adjacent to said first well, wherein said first strips arrange in approximately parallel; and a plurality of second strips having a third well and a fourth well with said second conductivity type in said semiconductor substrate, wherein said second strips arrange in approximately perpendicular to said first strips.

11. The bar circuit of claim 10, wherein said first conductivity type is opposite to said second conductivity type.

12. The bar circuit of claim 10, wherein said first strip and said second strip further comprise a fifth well and a sixth well with said first conductivity type separately in said first well and said third well.

13. The bar circuit of claim 10, wherein said second well and said fourth well are located a depth more than 3 um away from a surface of said semiconductor substrate.

14. The bar circuit of claim 10, wherein said second well and said fourth well separately have dopant concentrations different from dopant concentrations of said first well and said third well.

* * * * *